(12) United States Patent
Chaji

(10) Patent No.: US 12,482,686 B2
(45) Date of Patent: Nov. 25, 2025

(54) OFFSET ALIGNMENT AND REPAIR IN MICRO DEVICE TRANSFER

(71) Applicant: VueReal Inc., Waterloo (CA)

(72) Inventor: Gholamreza Chaji, Waterloo (CA)

(73) Assignee: VueReal Inc., Waterloo (CA)

(*) Notice: Subject to any disclaimer, the term of this patent is extended or adjusted under 35 U.S.C. 154(b) by 0 days.

(21) Appl. No.: 18/390,304

(22) Filed: Dec. 20, 2023

(65) Prior Publication Data

US 2024/0120231 A1 Apr. 11, 2024

Related U.S. Application Data

(63) Continuation of application No. 17/915,561, filed as application No. PCT/CA2021/050415 on Mar. 30, 2021.

(Continued)

(51) Int. Cl.
*H01L 21/68* (2006.01)
*H01L 21/66* (2006.01)
(Continued)

(52) U.S. Cl.
CPC ........ *H01L 21/68* (2013.01); *H01L 21/67259* (2013.01); *H01L 21/6835* (2013.01);
(Continued)

(58) Field of Classification Search
CPC ........... H01L 21/6835; H01L 21/67259; H01L 21/67265; H01L 21/68; H01L 21/681; H01L 22/12; H01L 22/22; H01L 2221/67; H01L 2221/683; H01L 2221/68304; H01L 2221/68309; H01L 2221/68322; H01L 2221/68318; H01L 2221/68363; H01L 2221/68368; H01L 2223/54426; H01L 23/544; H01L 24/00; H01L 24/74; H01L 24/91; H01L 24/92; H01L 24/98; H01L 25/00; H01L 25/0753; H01L 25/042; H01L 25/0652; H01L 25/0655; H01L 25/071; H01L 25/072; H01L 25/112; H01L 25/115; H01L 25/162; H01L 25/167; H01L 27/00
See application file for complete search history.

(56) References Cited

U.S. PATENT DOCUMENTS 10,020,420 B2 * 7/2018 Zou .................. H01L 24/81
10,134,803 B2 11/2018 Chaji et al.
(Continued)

FOREIGN PATENT DOCUMENTS

KR 1020190074285 A 6/2019
WO 202004716 A1 1/2020

OTHER PUBLICATIONS

WIPO: PCT International Search Report and Written Opinion relating to PCT application PCT/CA2021/050415, dated Jun. 17, 2020.

(Continued)

*Primary Examiner* — Gordon J Stock, Jr.

(57) ABSTRACT

This invention relates to the process of correcting misalignment and filling voids after a microdevice transfer process. The process involves transfer heads, measurement of offset and misalignment in horizontal, vertical, and rotational errors. An execution of the new offset vector for the next transfer corrects the alignment.

6 Claims, 8 Drawing Sheets

Related U.S. Application Data

(60) Provisional application No. 63/002,046, filed on Mar. 30, 2020, provisional application No. 63/057,238, filed on Jul. 27, 2020.

(51) Int. Cl.
   *H01L 21/67* (2006.01)
   *H01L 21/683* (2006.01)
   *H01L 23/00* (2006.01)
   *H01L 23/544* (2006.01)

(52) U.S. Cl.
   CPC .............. *H01L 22/22* (2013.01); *H01L 24/91* (2013.01); *H01L 23/544* (2013.01); *H01L 2221/68309* (2013.01); *H01L 2223/54426* (2013.01)

(56) References Cited

U.S. PATENT DOCUMENTS

| | | | | |
|---|---|---|---|---|
| 10,217,729 | B2 * | 2/2019 | Ahmed | H01L 24/95 |
| 10,535,546 | B2 | 1/2020 | Chaji | |
| 10,622,234 | B2 * | 4/2020 | Hsu | H01L 21/67288 |
| 11,127,781 | B2 * | 9/2021 | Thothadri | H01L 21/67144 |
| 11,538,786 | B2 * | 12/2022 | Luan | H01L 21/67132 |
| 11,581,210 | B2 * | 2/2023 | Ahn | H01L 21/67784 |
| 11,618,673 | B2 * | 4/2023 | Hsu | B81C 3/008 |
| | | | | 438/16 |
| 2017/0215280 | A1 * | 7/2017 | Chaji | H05K 13/0015 |
| 2018/0095124 | A1 * | 4/2018 | Chaji | H05K 13/0015 |
| 2018/0151804 | A1 * | 5/2018 | Chaji | H10K 71/221 |
| 2018/0190672 | A1 * | 7/2018 | Lee | H01L 27/156 |
| 2019/0080970 | A1 * | 3/2019 | Chaji | H01L 33/502 |
| 2019/0096774 | A1 * | 3/2019 | Chaji | H01L 21/6835 |
| 2019/0252350 | A1 * | 8/2019 | Schwarz | H01L 24/75 |
| 2019/0371868 | A1 * | 12/2019 | Chaji | H01L 25/0753 |
| 2020/0013662 | A1 * | 1/2020 | Chaji | H01L 27/1214 |
| 2022/0123165 | A1 * | 4/2022 | Ahn | H01L 25/0753 |
| 2022/0223754 | A1 * | 7/2022 | Ahn | H01L 33/38 |

OTHER PUBLICATIONS

KIPO: KR Office Action relating to KR application No. 10-2022-7035242, dated Jan. 6, 2025.

* cited by examiner

AL= Alignment; O&P=Offset & Print

AL= Alignment; O&P=Offset & Print

OFFSET ALIGNMENT AND REPAIR IN MICRO DEVICE TRANSFER

FIELD ON THE INVENTION

This invention relates to the process of correcting misalignment and filling voids after a microdevice transfer process. The invention further relates to an alignment process and transfer of multiple microdevices.

SUMMARY

The present invention relates to a method to correct misalignment in a transfer process of microdevices from a donor substrate to a system substrate, the method comprising, comparing a location of at least one of the transferred micro devices from the donor substrate into the system substrate in a first transfer of the microdevices against an intended position of the micro device in a next transfer on the system substrate, calculating an offset vector based on a new intended location in the system substrate for a next transfer of the micro devices and a extracted misalignment information from the first transfer of the microdevices and using the offset vector to execute the next transfer.

Another aspect of the present invention relates to a method to populate void microdevices, the method comprising, generating a map of the void microdevices, forming a new pad on top of an existing pad on a system substrate for any void micro devices in the map, aligning a micro device on a donor substrate with the new pad, transferring the aligned microdevice to the new pad and securing the transferred microdevice by the new pad.

Another aspect of the present invention relates to a method to operate a shared alignment system between multiple transfer heads, the method comprising, moving each transfer head or a system substrate to enable an offset and a transfer process, and each transfer head transferring microdevices from a donor substrate to the system substrate. The alignment system can be electrical or optical.

BRIEF DESCRIPTION OF DRAWINGS

The foregoing and other advantages of the disclosure will become apparent upon reading the following detailed description and upon reference to the drawings.

Figure 1:
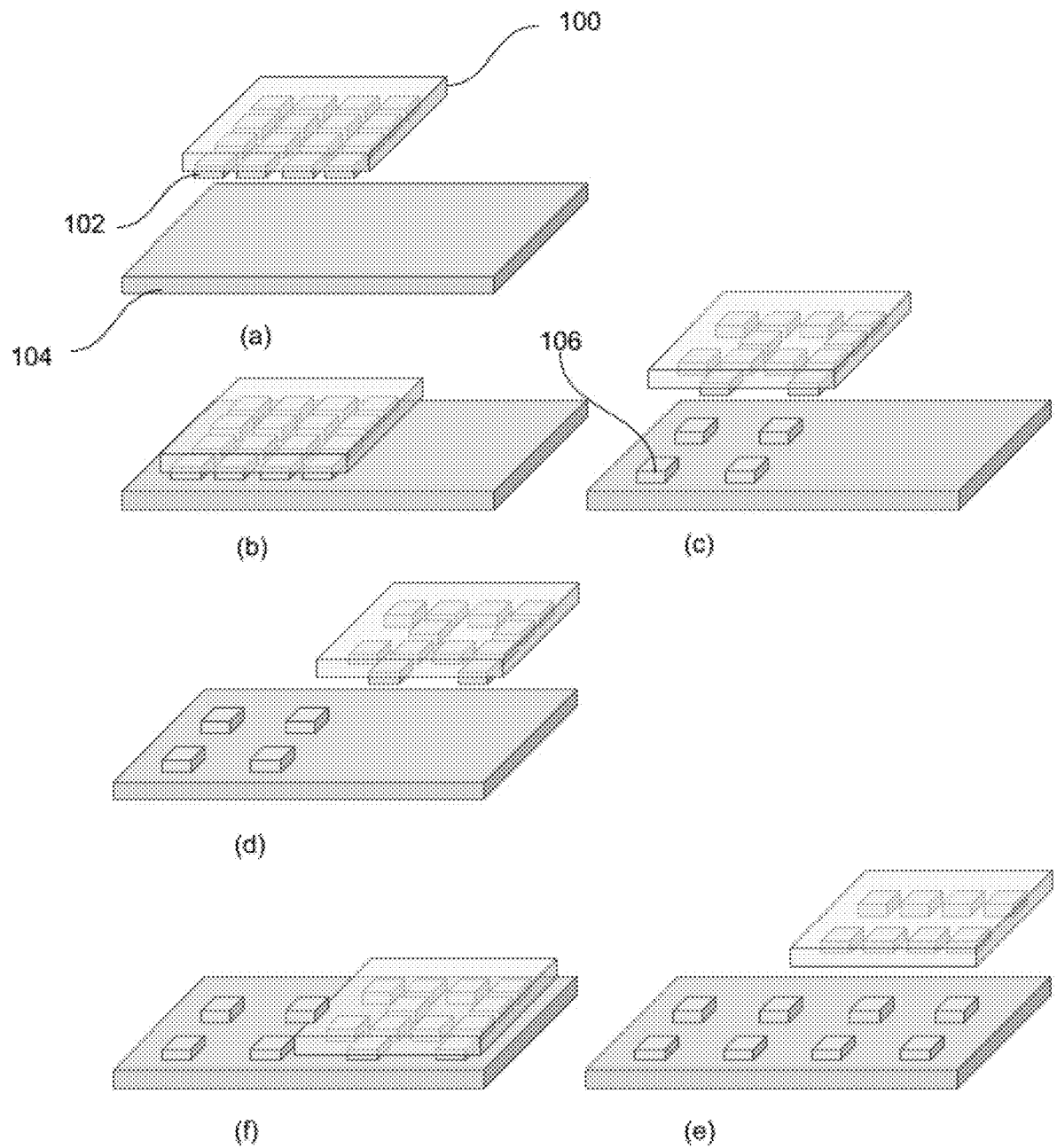
FIG. 1 shows a micro device transfer based on an offset and transfer process.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

In this description, the term "device" and "micro device" are used interchangeably. However, it is clear to one skilled in the art that the embodiments described here are independent of the device size.

The invention relates to transfer of a selected set of microdevices from a donor substrate to a receiver/system substrate while there can be already microdevices transferred in the system substrate. Or in another case, other structures exist in the receiver substrate that can interfere with the transfer. In this invention, we use the previously transferred microdevice to explain the invention, however similar topics can be applied to the other structures.

Microdevices can be microLED, OLED, microsensors, MEMs, and any other type of devices.

In one case, the microdevice has a functional body and contacts. The contacts can be electrical, optical, or mechanical contacts.

In case of optoelectronic microdevice, the device can have functional layers and charge carrying layers. Where charge carrying layers (doped layers, ohmics and contacts) transfer the charges (electron of hole) between the functional layers and contacts outside the device. The functional layers can generate electromagnetic signals (e.g., lights) or absorb electromagnetic signals.

System substrates can have pixels and pixel circuits that each pixel control at least one microdevice. Pixel circuits can be made of electrodes, transistors, or other components. The transistors can be fabricated with a thin film process, CMOS, or organic materials.

Transfer and Offset Alignment

When micro devices are transferred from one substrate to another substrate many aspects need to be addressed to facilitate a smooth transfer. One aspect is that of correct alignment in a transfer process. If a correct alignment does not occur, then there is a need to detect and fix the misalignment. One aspect of the present invention relates to detecting and correcting misalignment.

One method of transferring microdevices into a system substrate is based on a number of sequential steps. The first step is to align a donor substrate to a system substrate. Then targeting or focusing to a first intended area on the system substrate. After targeting, a transfer of selected microdevices into the first intended area of the system substrate takes place. After this initial transfer, create an offset for the donor substrate to a second intended area on the system substrate. Then completing a transfer of another set of selected microdevices into the second intended area of the system substrate.

The alignment of the donor substrate to the system substrate can be done with the first intended area. The offset and transfer process can continue to more intended areas. As the offset and transfer process continues, the donor substrate alignment with the system substrate can be compromised due to the accuracy limitation of the mechanical tooling used for the offset process.

In a method to stay aligned, a system detects the misalignment in the transfer device to the previous (first) intended area and calibrates the offset step to the current (second) intended area based on the extracted misalignment. The misalignment extraction data can be based on measuring where the microdevices are landed in the system substrate and where they were supposed to land. This data can include the offset error in vertical and horizontal directions and rotation error. In one related case, alignment marks can be used to extract the transferred device's locations. The alignment marks can be specifically designed and fabricated patterned in the system substrate. Also, the existing patterns in the system substrate can be used as alignment. In another related case, the pads developed in the system substrate as a connection to the transferred devices can be used to extract the location of transferred devices into system substrate. The pads can be electrical connections or mechanical connections. The challenge with pads with transferred devices is that they can be hidden under the devices and also deformed due to the transfer process. In another related case, the empty pads in close proximity to the transferred devices can be used to extract the location of transferred devices into system substrate.

In one case, a visual system (e.g., camera) can be used to take pictures/images of the transferred microdevices to extract the misalignment data. In another case, photo luminance's method can be used to extract the misalignment data. Here, a higher energy light is used to excite at least part of the microdevice. Also, markers can be used that excite under the same light. The position of the microdevice is calculated relative to the marker. And the misalignment is extracted. In another related case, the marker or microdevice do not excite and so two image systems are used one for the excited and one for the normal lighting condition. The two images can be taken in the same time or different time frame.

FIG. 1 shows a microdevice transfer based on an offset and transfer process. During the first step of the transfer (FIG. 1a) the donor substrate 100, which includes at least more than one micro device 102, is aligned with the system substrate 104. During the second step (FIG. 1B and FIG. 1c), the microdevices are transferred into the system substrate 104. FIG. 1c shows the transferred microdevices 106 on system substrate 102. The transfer mechanism can be performed by contacting the system substrate FIG. 1B or by other means such as light/laser or a temperature assisted transfer.

During the third step (FIG. 1d), the donor substrate 100 is moved (offsetted) to another intended area of the system substrate 104. During the fourth step (FIG. if and FIG. 1e), the devices 102 are transferred into the system substrate. The offset in step of FIG. 1d can cause misalignment due to the mechanical imperfections, system substrate imperfection, and or environmental changes.

Figure 2A:
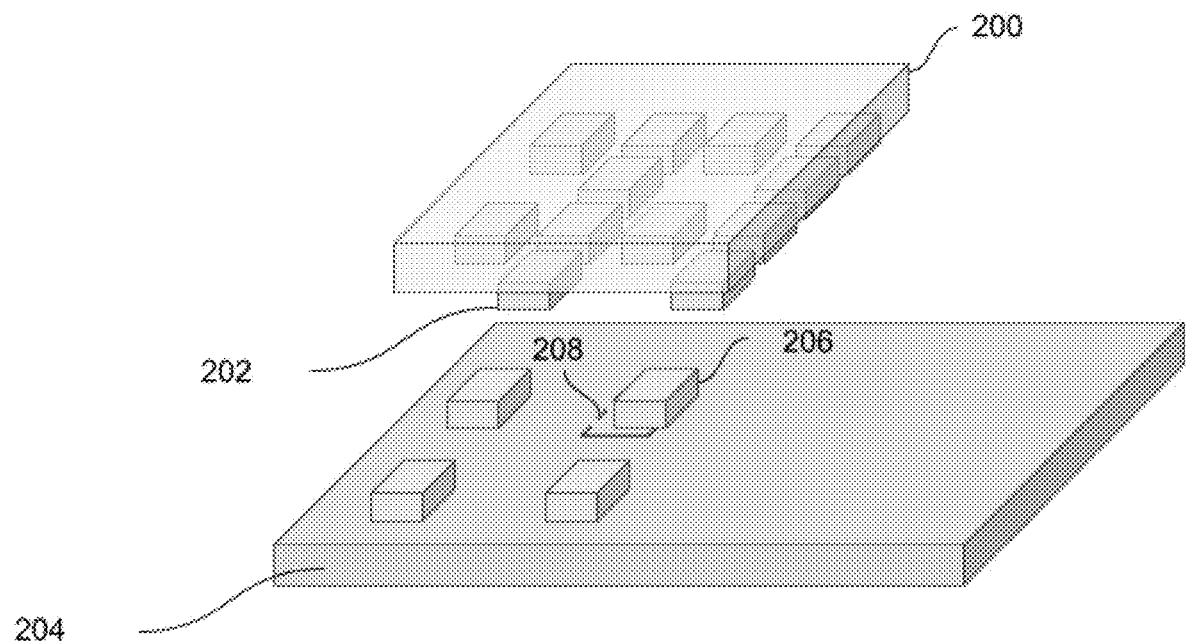
FIGS. 2a-2b show a method of correcting for the misalignment in the offset step.
Figure 2B:
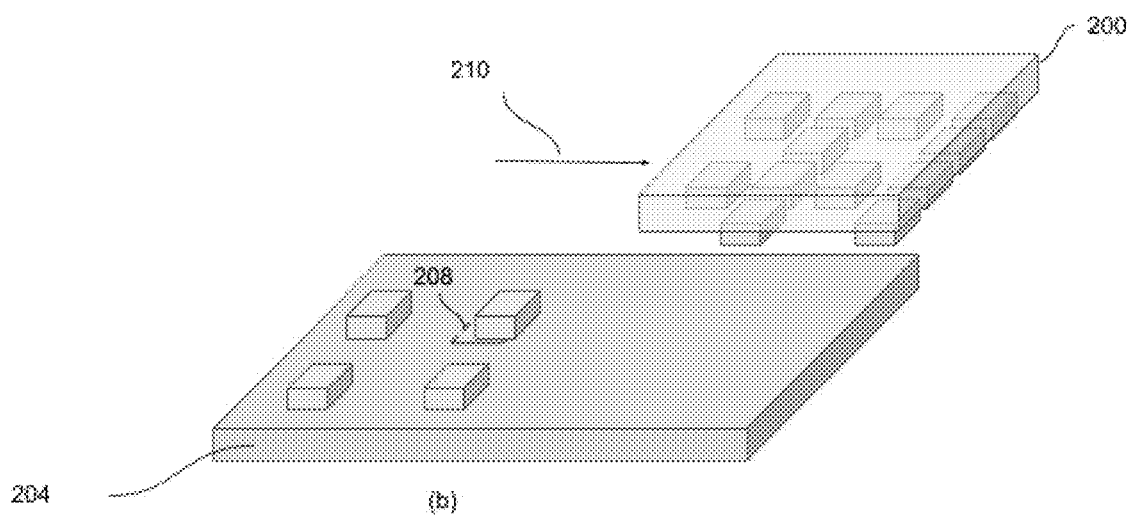

FIGS. 2a-2b show a method of correcting for the misalignment in the offset step in FIG. 1d. Here as demonstrated in FIG. 2a, the location of at least one of the transferred microdevices 206 from the microdevices 202 in the donor substrate 200 into the system substrate 204 is compared to the intended position 206 of the microdevice on the system substrate 204. The comparison of the location of the transferred microdevices against the intended location can be based on comparing the location of the transferred microdevices by a marker 208 on the backplane. The misalignment data is calculated/extracted which can include horizontal direction ($\Delta x$), vertical direction ($\Delta y$) and rotation error ($\Delta r$). As demonstrated in FIG. 2b, the offset vector 210 is calculated based on the new intended location in the system substrate and the extracted misalignment information from previous transfer ($\Delta x$, $\Delta y$, $\Delta r$). An execution of the new offset vector for the next transfer corrects the alignment.

Figure 2C:
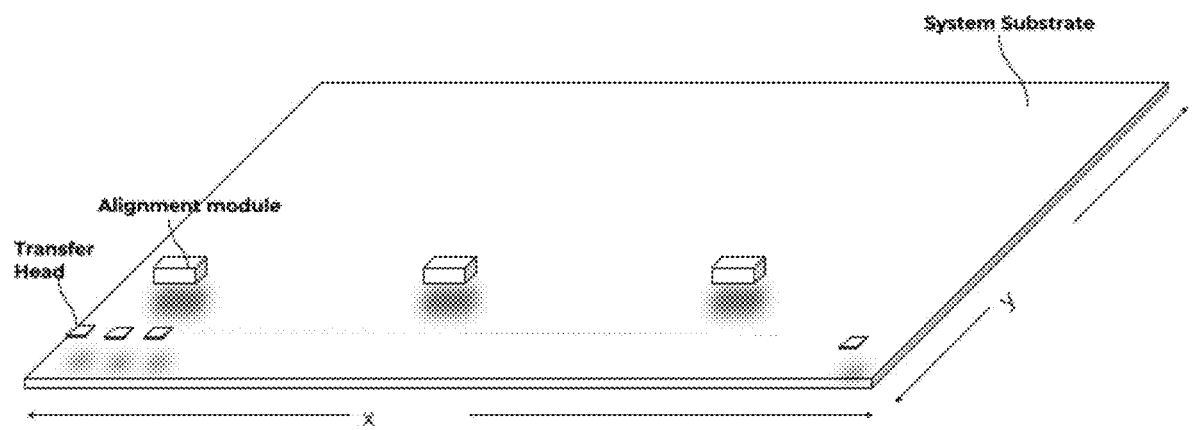
FIG. 2c shows a system with a shared main alignment system between multiple transfer heads with an alignment module.

FIG. 2c shows a system with a shared main alignment system between multiple transfer heads with an alignment module. Here, each transfer head can transfer microdevices from a donor substrate into a system substrate. Either the system substrate or the transfer head can move to enable offset and transfer process. The alignment system can be optical or electrical. In one case, alignment marks on the donor substrate are aligned with corresponding alignment marks in the system substrate. In another case, the microdevices in the donor substrate are directly aligned to the intended position in the system substrate. In one case, the transfer head is loaded and aligned to a fixed area in the system substrate.

In one case, the donor substrate is loaded in the transfer head, the alignment system is moved to the transfer head. The transfer head is in a pre-defined position in relation to the system substrate, the alignment system is used to move, rotate, or tilt the donor substrate to make it align with the pre-defined position in the system substrate. In one case, the predefined position can be the edge of the system substrate. In another case, it can be the start position for the transfer process.

In another related case, the position of few marks are extracted from the system substrate. Every time a donor substrate is loaded in the transfer head, the position of some markers in the donor substrate is extracted using the shared alignment system. The misalignment is calculated for each loaded donor substrate based on the extracted positions.

In another related case, the transfer head is aligned with the donor substrate using a shared alignment system and picks the donor substrate. The transfer head is calibrated with transfer substrate and as a result, it can move the donor substrate into the proper position.

Figure 2D:
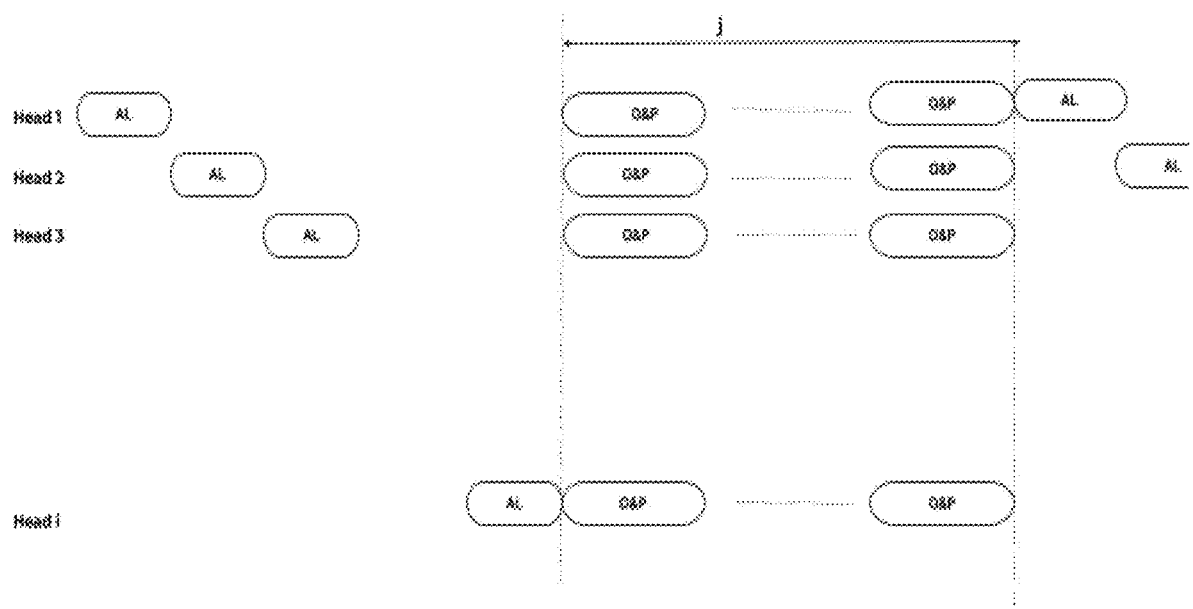
FIG. 2d shows an exemplary timing diagram for sharing the alignment system between multiple transfer heads.
Figure 2E:
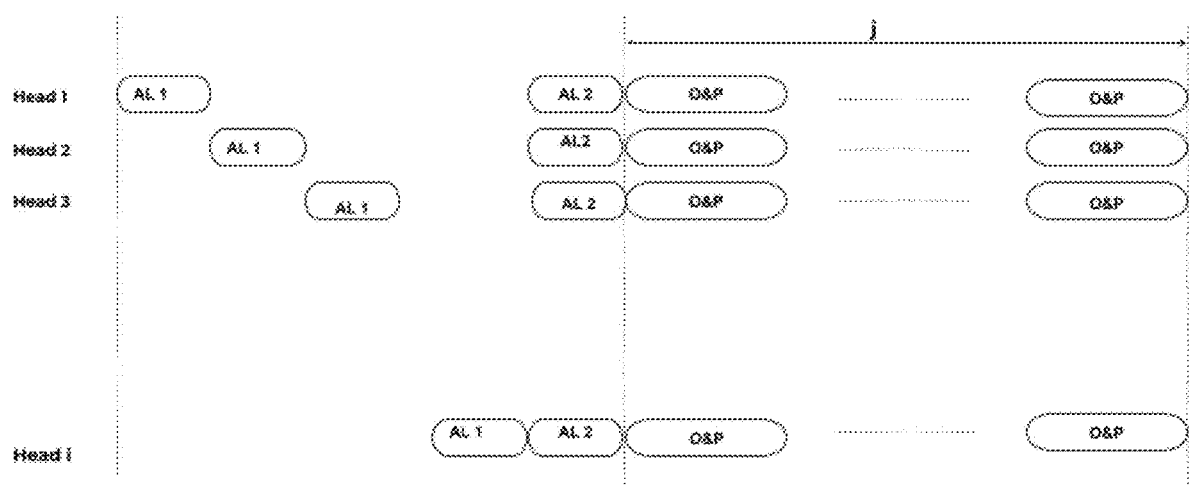
FIG. 2e shows an exemplary process for making two part alignment processes.
Figure 2F:
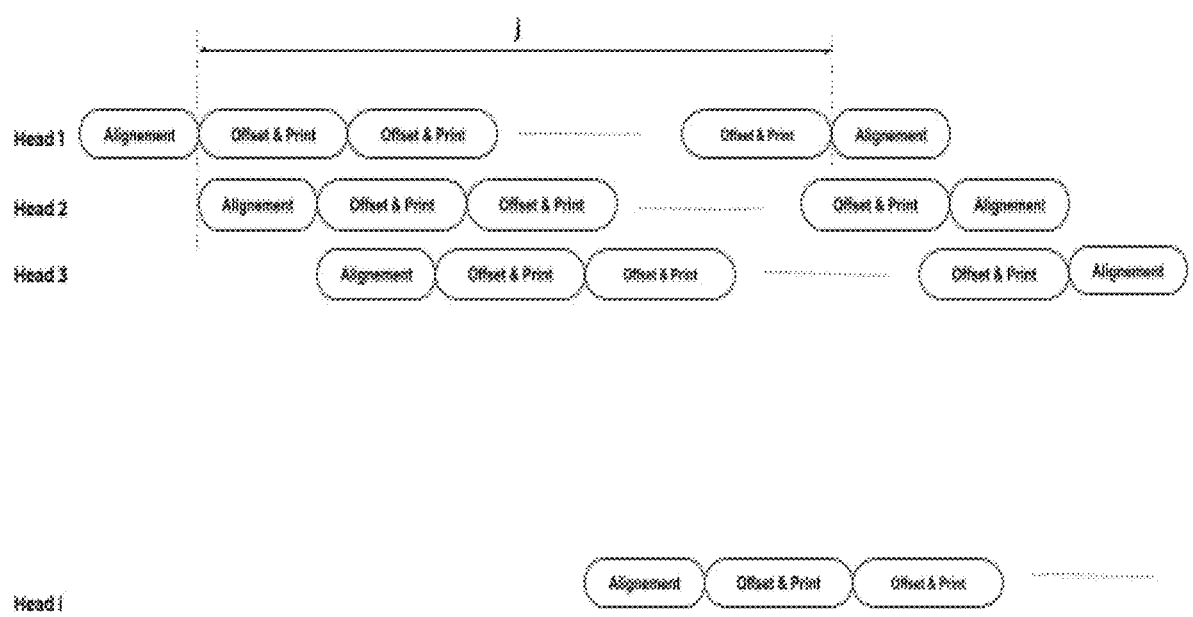
FIG. 2f shows the donor substrate (or cartridge) is loaded in the first head and then the alignment is performed for the first transfer head.

FIG. 2d shows an exemplary timing diagram for sharing the alignment system between multiple transfer heads. In one case, the alignment (AL in FIG. 2d) for the multiple heads happens and then the transfer starts by each transfer head (O & P for offset and print in FIG. 2d). However, the throughput will suffer as there is no transfer during the alignment. The alignment process can be separated in two parts, the first part which includes using the shared alignment system to extract or measure alignment information. The second part is extracting and performing the alignment process. The second part can be done for several heads at once. FIG. 2e shows an exemplary process for making two part alignment processes. As demonstrated in FIG. 2f, the donor substrate (or cartridge) is loaded in the first head and then the alignment is performed for the first transfer head. Then the transfer and offset process starts for the first transfer head. Then the alignment is performed for the second transfer head. And after the alignment, transfer and offset starts for the second transfer head. This can continue for more transfer heads. After a new head is loaded into a transfer head, the alignment is performed for that head and the offset and transfer is performed.

Combination of the methods described here can be used to further improve the alignment and transfer throughput.

Transfer and Defects

Transferring microdevices into a system substrate is associated with some defects. The defects can be different types in nature such as void (no transferred device), physically damaged, tilted, misplaced, etc. In one case, the defective devices can be removed and turns all the defects into a void type defect. Also, the microdevices can be tested and verified prior to transfer to reduce the possibility of other defects type. In this case, most of the defects will be void. Furthermore, the defective microdevices can be removed to create void defects. In such case, the removal can be done by debonding the microdevice or using a laser to disintegrate the devices.

To repopulate void devices in the system substrate, a new pad is formed on top of the existing one (pads) or the existing pad is removed, and a new taller pad is formed. Then the new pad is used to transfer a new microdevice into the void position in the substrate. After the transfer, the transfer microdevice can be pushed down to get at the same proximity height of the other adjacent microdevices. In a related case, the new pads on top of existing pads can be soft material (e.g., polymers, nano particle, etc.) that can be pushed down or out of the pads.

In addition, the microdevice can be pushed down by a force during the transfer to avoid interfering with the already transferred microdevices. The push force can be created mechanically, optically, or by heat.

Figure 3:
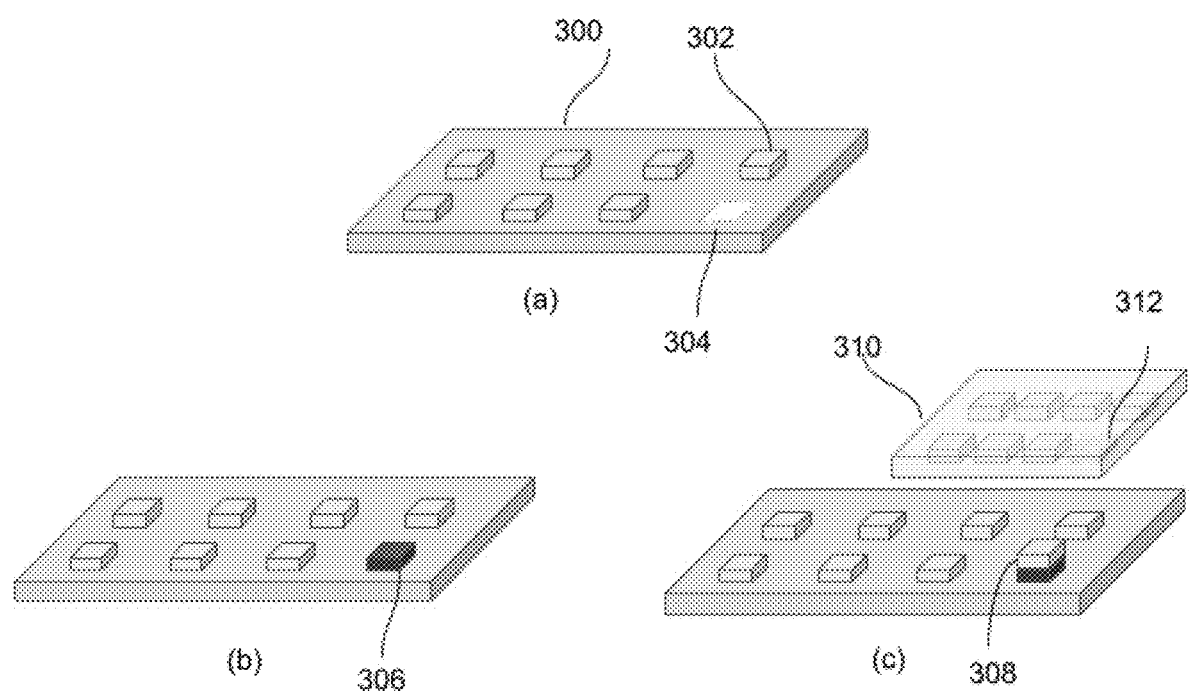
FIG. 3 shows a system substrate with transferred microdevices along with voids and new pad with a higher height.

FIG. 3 (comprising of FIGS. 3a, 3b and 3c) shows a system substrate 300 with transferred microdevices 302. In one case, the microdevice is not transferred 304 (FIG. 3a). Here the void 304 can also be the result of removing the defective microdevices from a donor substrate prior to transferring the microdevices to the system substrate 300 or it can be the result of transfer itself. It can be the result of removing the defective micro devices from the system substrate or a place left for populating for a defective micro device.

In order to fix the defects, a map of the defect is generated and new pad 306 is formed for the defective microdevice (FIG. 3b). In one approach, the defects are extracted from the image taken by a camera. The pad height of the new pad 306 should be high enough to avoid any interference between a donor substrate 310 and existing micro devices in the system substrate (FIG. 3c). One of the microdevices 312 on the donor substrate 310 is aligned with the new pad 306 and then transferred on the new pad 306. The transferred microdevice 308 can be secured by the pad 306.

Figure 4:
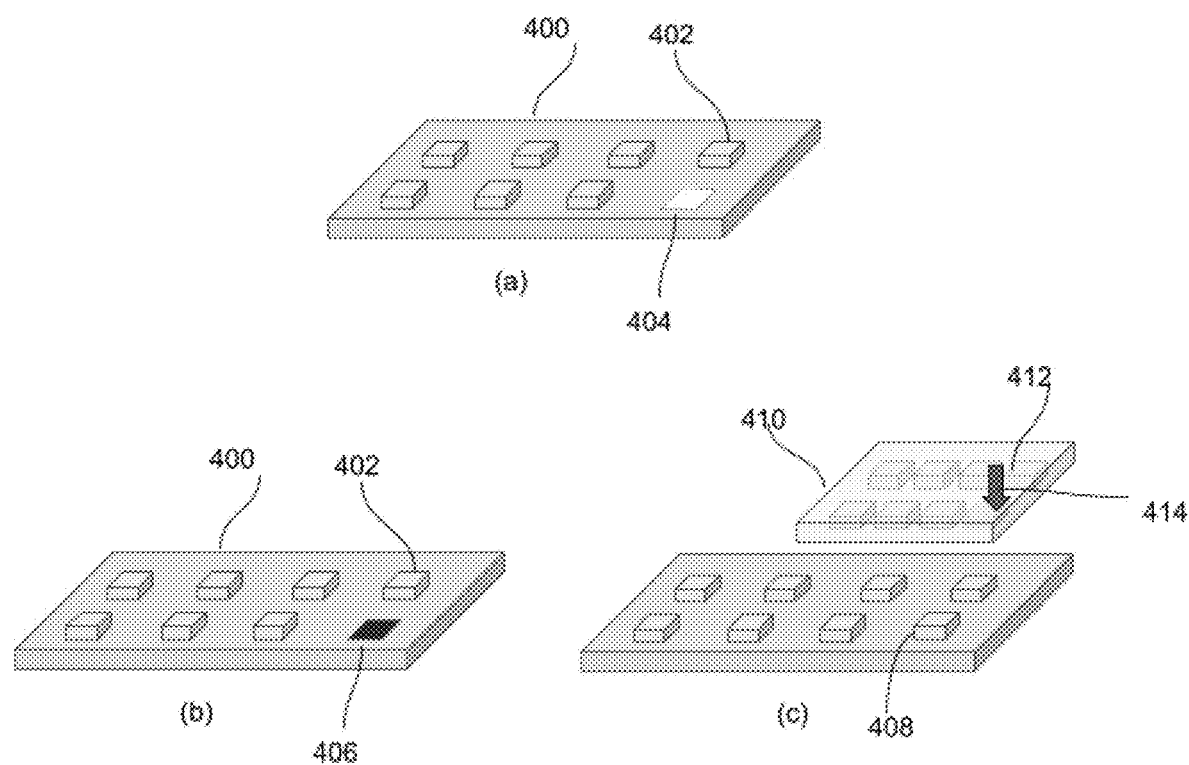
FIG. 4 (comprising of 4a, 4b and 4c) shows a system substrate with transferred microdevices along with voids and new pad with a lower height.

FIG. 4 (comprising of 4a, 4b, and 4c) shows a system substrate 400 with transferred microdevices 402. In one case, the microdevice is not transferred 404 (FIG. 4a). Here the void 404 can be the result of removing the defective micro devices from a donor substrate prior to transferring the microdevices to the system substrate 400. It can also be the result of transfer itself or the result of removing the defective microdevices from the system substrate or a place left for populating for a defective micro device.

Again, in this case, a map of the defect is generated and new pads 406 is formed for the defective micro device (FIG. 4b). The pad height can be shorter than the microdevice (FIG. 4c). In one case, the pad can be the original pad in the system substrate. One of the micro devices 412 on the donor substrate 410 is aligned with the new pads 406 and then transferred on the new pad 406. The new transferred microdevices 408 can be pushed to the system substrate 400 by a force of 414. The force can be optical, electrostatic, electromagnetic, chemical, mechanical, and etc. Additionally, the pad 406 can be conductive or adhesive.

The invention also is a method to populate void micro devices, the method comprising, generating a map of the void microdevices, forming a new pad on top of an existing pad on a system substrate for any void microdevices in the map, aligning a microdevice on a donor substrate with the new pad, transferring the aligned micro device to the new pad, and securing the transferred micro device by the new pad.

The foregoing description of one or more embodiments of the invention has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended hereto.

The invention claimed is:

1. A method to populate void micro devices, the method comprising:
   generating a map of the void microdevices;
   forming a new pad on top of an existing pad on a system substrate for any void microdevices in the map wherein the new pad is taller than the existing pad;
   aligning a microdevice on a donor substrate with the new pad;
   transferring the aligned micro device to the new pad; and
   securing the transferred micro device by the new pad.

2. The method of claim 1, wherein the new pad is used to transfer a new microdevice into a void position in the system substrate.

3. The method of claim 1, wherein after the transfer, the transferred microdevice is pushed down to get at a same proximity height of other adjacent microdevices.

4. The method of claim 1, wherein the new pad on top of existing pad is of soft materials, the soft materials include one or more of polymers and nano particles.

5. The method of claim 1, wherein the microdevice is pushed down by a force during the transfer to avoid interfering with already transferred microdevices.

6. The method of claim 5, wherein the push force is created mechanically, optically, or by heat.

* * * * *